(12) United States Patent
Joshi et al.

(10) Patent No.: US 7,073,569 B1
(45) Date of Patent: Jul. 11, 2006

(54) COOLING ASSEMBLY WITH SPIRALLY WOUND FIN

(75) Inventors: Shrikant M. Joshi, Williamsville, NY (US); Mohinder S. Bhatti, Williamsville, NY (US); Ilya E. Reyzin, Williamsville, NY (US); Russell S. Johnson, Tonawanda, NY (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 11/100,665

(22) Filed: Apr. 7, 2005

(51) Int. Cl.
*F28D 15/00* (2006.01)

(52) U.S. Cl. .............. 165/104.33; 165/80.4; 361/699; 257/715; 174/15.1

(58) Field of Classification Search .......... 165/104.33, 165/104.21, 80.4; 361/699, 697, 704; 257/714; 174/15.1
See application file for complete search history.

(56) References Cited

U.S. PATENT DOCUMENTS

| | | | |
|---|---|---|---|
| 4,686,606 A * | 8/1987 | Yamada et al. ............. 361/699 |
| 5,019,880 A * | 5/1991 | Higgins, III. ............... 257/714 |
| 5,029,636 A * | 7/1991 | Kadle ....................... 165/109.1 |
| 5,144,531 A * | 9/1992 | Go et al. ..................... 361/702 |
| 5,304,846 A | 4/1994 | Azar .......................... 257/722 |
| 5,394,936 A * | 3/1995 | Budelman .............. 165/104.33 |
| 5,441,102 A * | 8/1995 | Burward-Hoy ........ 165/104.25 |
| 6,059,026 A * | 5/2000 | Bailly et al. ................ 165/174 |
| 6,148,907 A * | 11/2000 | Cheng ......................... 165/121 |
| 6,205,803 B1* | 3/2001 | Scaringe .................... 62/259.2 |
| 6,324,058 B1* | 11/2001 | Hsiao ........................ 361/699 |
| 6,366,462 B1* | 4/2002 | Chu et al. .................... 361/699 |
| 6,422,307 B1 | 7/2002 | Bhatti ........................ 165/185 |
| 2003/0164231 A1* | 9/2003 | Goodson et al. ....... 165/104.11 |
| 2005/0103472 A1* | 5/2005 | Lofland et al. ............ 165/80.4 |

* cited by examiner

*Primary Examiner*—Terrell McKinnon
(74) *Attorney, Agent, or Firm*—Patrick M. Griffin

(57) ABSTRACT

The subject invention provides a heat sink for a liquid cooled cooling assembly for removing heat generated by an electronic device. The heat sink includes a flow diverter having a hyperbolic cross section disposed on a base for absorbing a significant portion of the heat from the electronic device. An inlet tube directs an impinging flow of cooling fluid directly onto the flow diverter to remove the heat stored within the flow diverter. A spiral wall extends in an increasing spiral from the flow diverter to define a spiral channel for discharging the flow of cooling fluid. The spiral wall includes a plurality of louvers for creating turbulence in the flow of cooling fluid for maintaining a high heat transfer coefficient between the spiral wall and the cooling fluid.

29 Claims, 5 Drawing Sheets

COOLING ASSEMBLY WITH SPIRALLY WOUND FIN

BACKGROUND OF THE INVENTION

1. Field of the Invention

The subject invention relates to a cooling assembly for cooling an electronic device such as a microprocessor or a computer chip.

2. Description of the Prior Art

These electronic devices generate a high concentration of heat, typically a power density in the range of 5 to 35 W/cm$^2$. Accordingly, research activities have focused on developing more efficient cooling assemblies capable of efficiently dissipating the heat generated from such electronic devices, while occupying a minimum of space.

A forced air cooling assembly typically includes a heat exchanger and a heat sink, and cools the electronic device by natural or forced convection cooling methods. The electronic device is attached to the heat sink and transfers heat thereto. The heat exchanger typically uses air to directly remove the heat from the heat sink. However, air has a relatively low heat capacity. Such forced air cooling assemblies are suitable for removing heat from relatively low power heat sources with a power density in the range of 5 to 15 W/cm$^2$. However, the increased computing speeds have resulted in a corresponding increase in the power density of the electronic devices in the order of 20 to 35 W/cm$^2$, thus requiring more effective cooling assemblies.

In response to the increased heat produced by the electronic devices, liquid-cooled cooling assemblies, commonly referred to as liquid cooled units ("LCUs") were developed. The LCUs employ a heat sink in conjunction with a high heat capacity cooling fluid, like water or water-glycol solutions, to remove heat from these types of higher power density heat sources. One type of LCU circulates the cooling fluid through the heat sink to remove the heat absorbed from the heat source affixed thereto. The cooling fluid is then transferred to a remote location where the heat is easily dissipated into a flowing air stream with the use of a liquid-to-air heat exchanger and an air moving device such as a fan or a blower. These types of LCUs are characterized as indirect cooling units since they remove heat form the heat source indirectly by a secondary working fluid. Generally, a single-phase liquid first removes heat from the heat sink and then dissipates it into the air stream flowing through the remotely located liquid-to-air heat exchanger. Such LCUs are satisfactory for a moderate heat flux less than 35 to 45 W/cm$^2$.

The U.S. Pat. No. 5,304,846, issued to Azer et. al., and the U.S. Pat. No. 6,422,307, issued to Bhatti et. al., each disclose a typical heat sink assembly used in a LCU. The heat sink assemblies include a base plate with a plurality of fins having smooth sidewalls extending upwardly from the base plate. In operation, the base plate absorbs the heat from the electronic device and transfers the heat to the fins. A cooling fluid flows past the smooth walled fins, drawing the heat from the fins, thereby removing the heat from the heat sink. The flow of cooling fluid may be directed parallel to the fins or impinged thereon.

The U.S. Pat. No. 5,019,880, issued to Higgins, discloses a heat sink that includes a circular base with a central flow diverter having a conical shape extending upwardly from the base. A plurality of planar fins is disposed radially about the circumference of the flow diverter and extend upwardly from the base to a lid. An inlet is disposed above the lid for directing a flow of cooling fluid perpendicularly onto the flow diverter. The flow of cooling fluid then circulates radially outward to the outer periphery of the base through a plurality of flow channels defined between the planar fins.

The amount of heat transferred between the fins and the cooling fluid is dependent on a heat transfer coefficient therebetween. The heat transfer coefficient is dependent on a thermal boundary layer, which is a layer of stagnant cooling fluid adjacent each of the fins. The thermal boundary layer acts as an insulator, limiting the heat transfer coefficient. As the cooling fluid flows past the fins uninterrupted, the thermal boundary layer becomes thicker, decreasing the heat transfer coefficient and thereby decreasing the effectiveness of the heat sink assembly. Additionally, the amount of heat stored in each of the fins varies according to the distance between each of the fins and the heat source, with the highest concentration of heat occurring directly above the heat source, with the fins disposed farther from the heat source absorbing less heat. Therefore, the heat transfer to the cooling fluid at the outer periphery of the heat sink is less efficient than the heat transfer to the cooling fluid directly above the heat source.

SUMMARY OF THE INVENTION AND ADVANTAGES

The subject invention provides a heat sink assembly for removing heat from an electronic device. The heat sink assembly includes a base having a top surface and a lid having a bottom surface in spaced relationship with and parallel to the top surface of the base. A flow diverter extends upwardly from the top surface of the base toward the bottom surface of the lid. The lid defines an inlet aligned with the flow diverter for impinging the flow of cooling fluid on the flow diverter. A spiral wall extends between the top surface of the base and the bottom surface of the lid and is disposed in an increasing spiral from the flow diverter to define a spiral channel having an outlet for directing the flow of cooling fluid radially relative to the flow diverter.

Accordingly, the subject invention provides a heat sink with a flow diverter for absorbing heat generated from the electronic device. The flow of cooling fluid removes the heat stored in the flow diverter, with the spiral wall directing the flow of cooling fluid away from the flow diverter. The flow diverter provides a large mass directly above the heat source for absorbing a significant amount of the heat generated thereby. The spiral wall absorbs additional heat from the heat source, which is transmitted radially outward from the heat source through the base plate. The direct impingement of the flow of cooling fluid on the flow diverter removes the majority of heat stored therein, with the remaining heat stored in the spiral wall and the base removed by the flow of cooling fluid as the cooling fluid circulates through the spiral channel. The subject invention, therefore, provides a more efficient heat sink for a cooling assembly.

BRIEF DESCRIPTION OF THE DRAWINGS

Other advantages of the present invention will be readily appreciated, as the same becomes better understood by reference to the following detailed description when considered in connection with the accompanying drawings wherein.

DETAILED DESCRIPTION OF THE INVENTION

Referring to the Figures, wherein like numerals indicates like or corresponding parts throughout the several views, a heat sink assembly is generally shown at 10.

Figure 1:
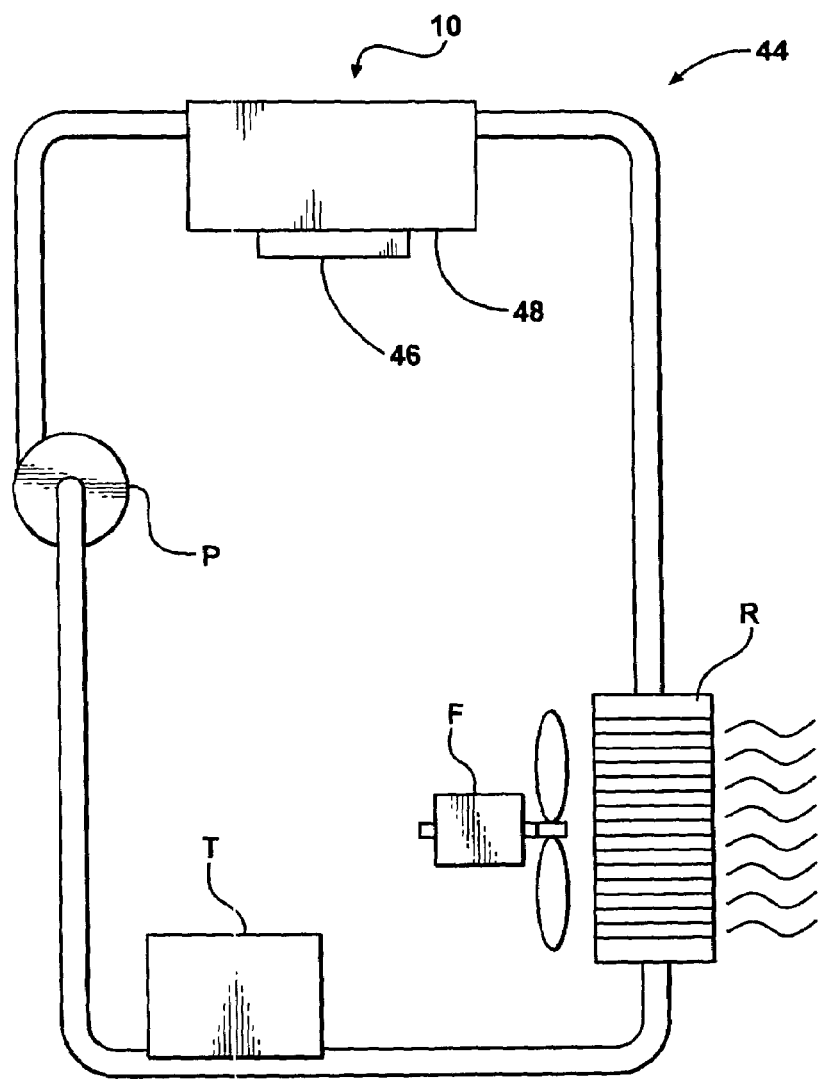
FIG. 1 is a schematic view of a liquid cooling system.

Referring to FIG. 1, the operation of the heat sink 10 is incorporated into a liquid cooling assembly, generally shown at 44 in FIG. 1. A working fluid mover, such as a pump P, moves the flow of cooling fluid, usually a liquid, through a cooling fluid storage tank T, that stores excess cooling fluid. The pump P moves the cooling fluid through a heat extractor assembly to dissipate heat from the cooling fluid. The heat extractor includes a fan F and a radiator R. The radiator R can be of the well known type including tubes with cooling tins between the tubes to exchange heat between the cooling fluid passing through the tubes and air forced through the radiator R by the fan F.

Figure 4:
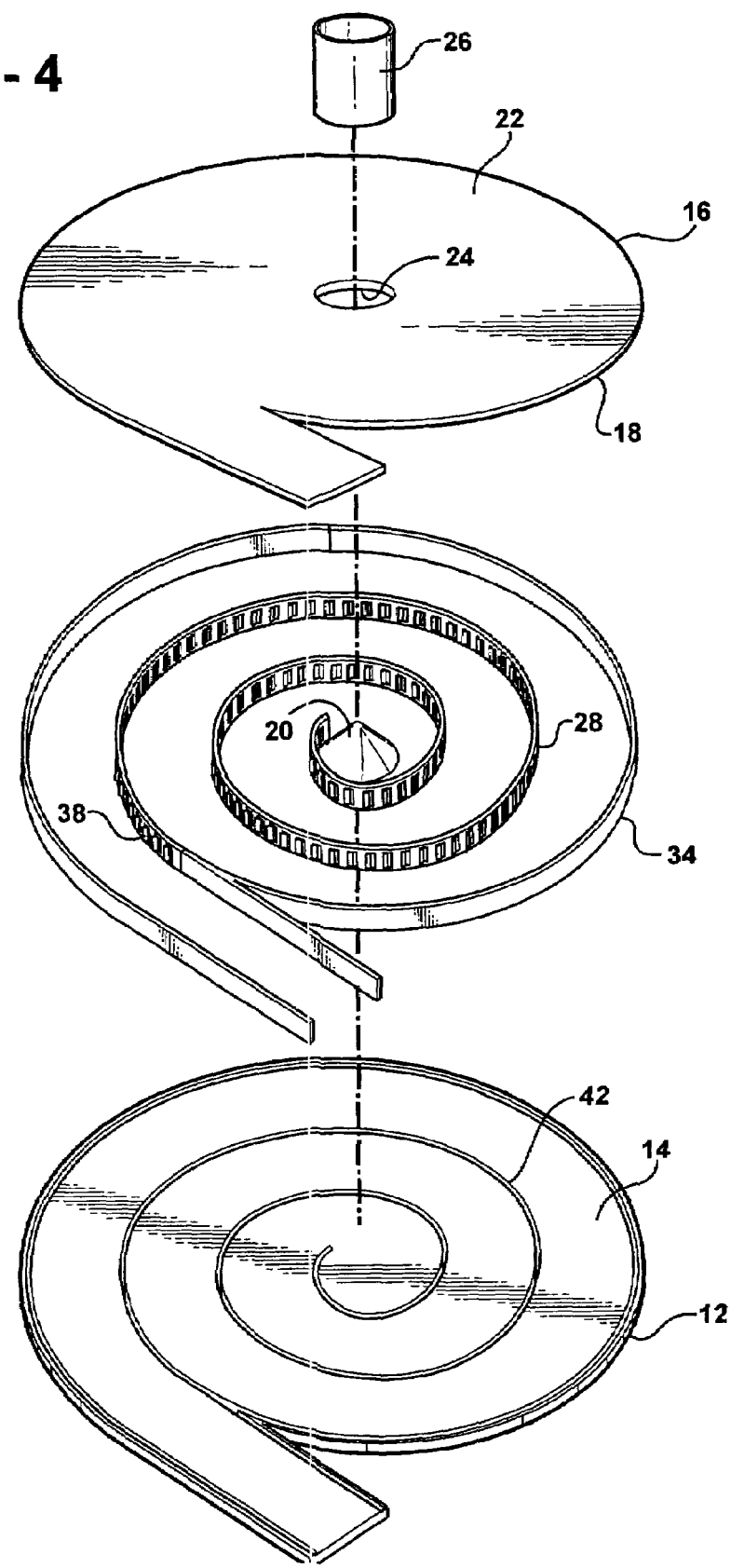
FIG. 4 is an exploded perspective view of the heat sink of FIG. 2.
Figure 5:
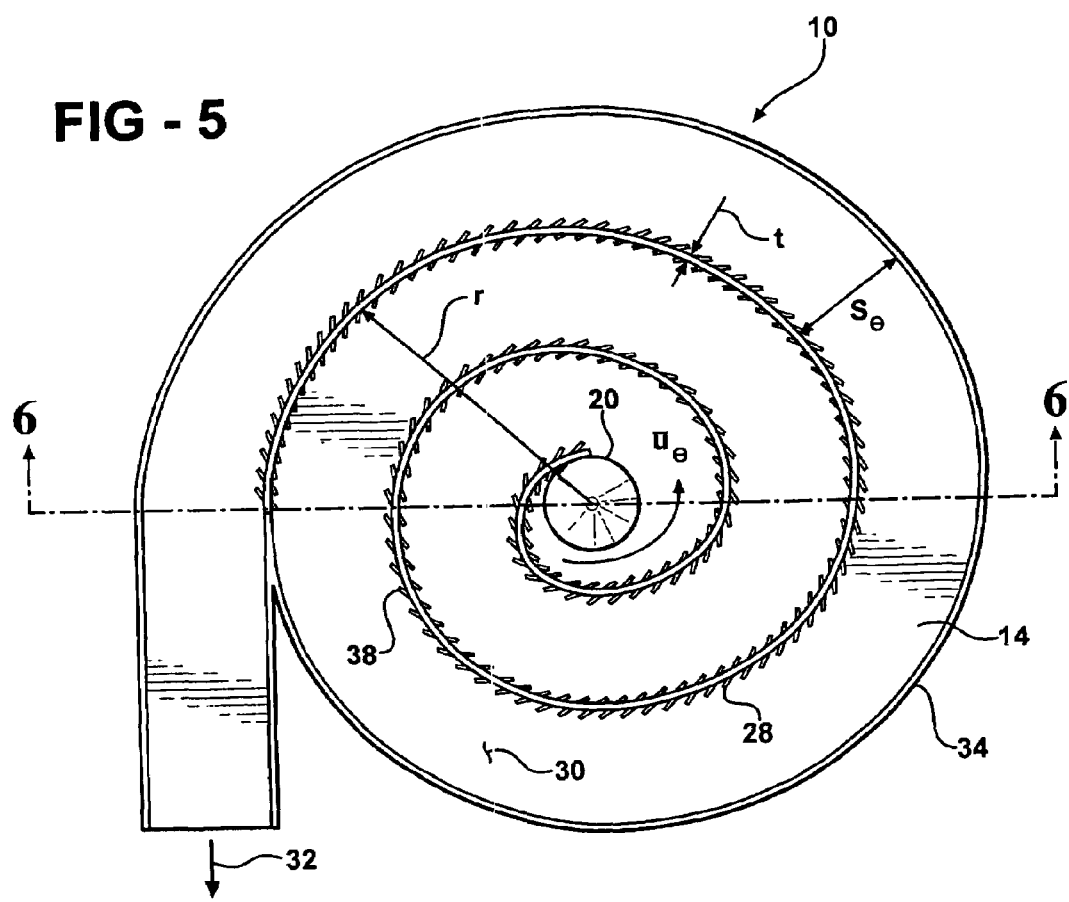
FIG. 5 is a top view of the heat sink as shown in FIG. 3.
Figure 6:
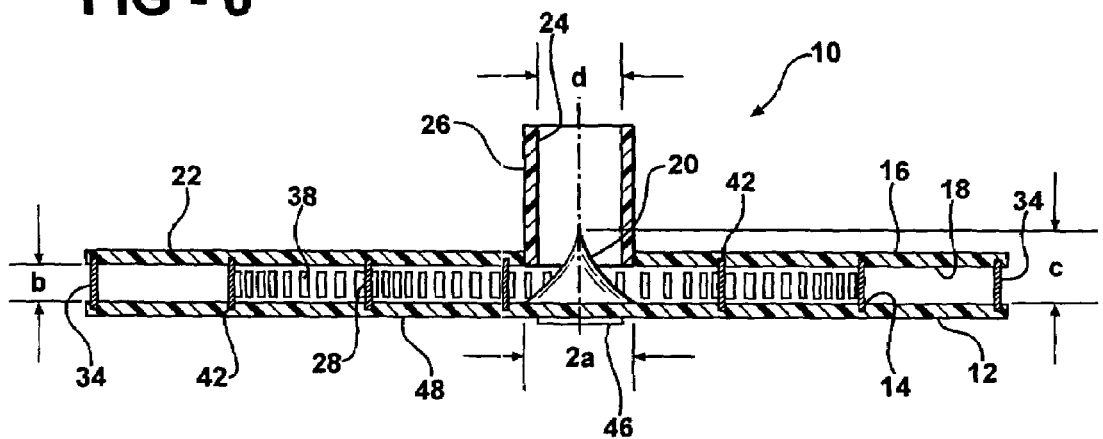
FIG. 6 is a cross sectional view of the heat sink along cut line 6—6 of FIG. 5.

Referring to FIGS. 2 through 6, the heat sink 10 includes a base 12 having a top surface 14 and a lid 16 having a bottom surface 18, best shown in FIGS. 4 and 6, in spaced relationship with and parallel to the top surface 14 of the base 12. A flow diverter 20 extends upwardly from the top surface 14 of the base 12 toward the bottom surface 18 of the lid 16. The lid 16 includes a top surface 22 and an inlet 24 including an inlet tube 26 extending upwardly form the top surface 22 of the lid 16. The inlet 24 is aligned with the flow diverter 20 for directing an impinging flow of cooling fluid on the flow diverter 20. A spiral wall 28 extends between the top surface 14 of the base 12 and the bottom surface 18 of the lid 16 and is disposed in an increasing spiral from the flow diverter 20. The spiral wall 28 defines a spiral channel 30 having an outlet 32 for directing the flow of cooling fluid radially in a spiral relative to the flow diverter 20. Preferably, the base 12, the lid 16, the spiral wall 28 and the flow diverter 20 are manufactured from a thermally conductive material.

The base 12 and the lid 16 are generally circular with the outlet 32 extending tangentially therefrom. An outer wall 34 extends between the base 12 and the lid 16 about an outer periphery of the base 12 and the lid 16 for encapsulating the heat sink 10, so that the flow of cooling fluid enters through the inlet tube 26 and is discharged through the outlet 32.

Figure 8:
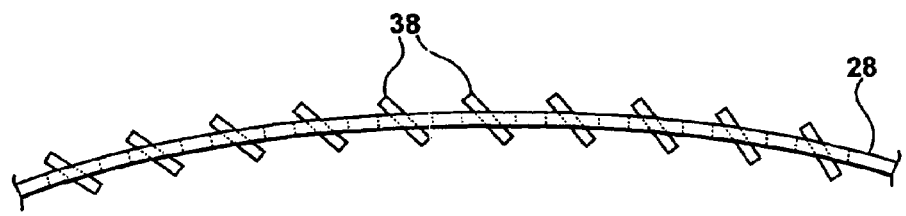
FIG. 8 is a fragmentary top view of the spiral wall of FIG. 7.
Figure 7:
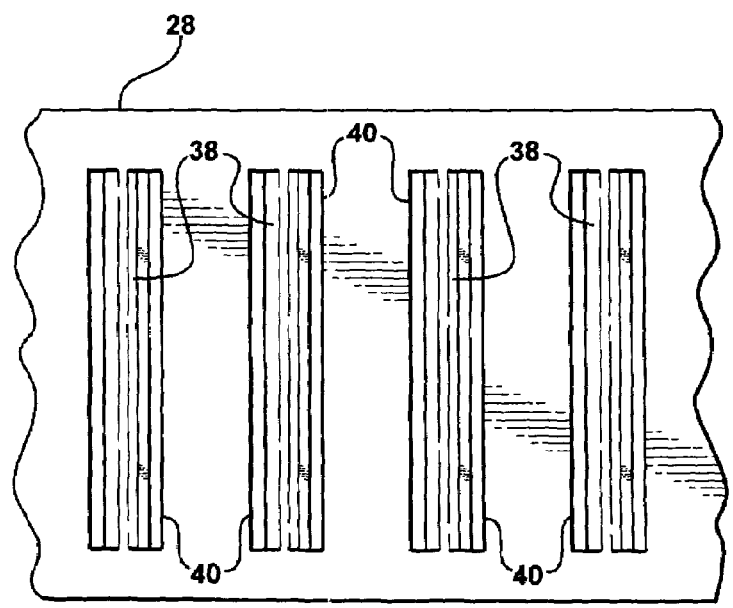
FIG. 7 is an enlarged fragmentary side view of the spiral wall of the heat sink.

The spiral wall 28 includes a plurality of louvers 38 for creating turbulence in the flow of cooling fluid. Preferably, as best shown in FIGS. 7 and 8, the louvers 38 are perpendicular to the base 12 and parallel to each other. If the flow of cooling fluid is allowed to flow past the surface for the spiral wall 28 uninterrupted, the thermal boundary layer between the spiral wall 28 and the flow of cooling fluid increases in thickness, thereby decreasing the heat transfer coefficient therebetween. The louvers 38 in the spiral wall 28 interrupt the flow of cooling fluid adjacent the spiral wall 28, keeping the thermal boundary layer to a minimum and maintaining a high heat transfer coefficient. Referring to FIGS. 7 and 8, the louvers 38 are preferably created in the spiral wall 28 by forming two parallel cuts 40 in the spiral wall 28 and twisting the portion of the spiral wall 28 therebetween to form the louvers 38. It should be appreciated, however, that any obstruction in the spiral wall 28 that interrupts the flow of cooling fluid and augments the thermal boundary layer is contemplated by the subject invention to maintain a high heat transfer coefficient.

Referring to FIG. 4, the top surface 14 of the base 12 defines a spiral groove 42, and the bottom surface 18 of the lid 16 defines a corresponding spiral groove 42. The spiral wall 28 is disposed in the grooves 42 and sandwiched between the base 12 and the lid 16. The top surface 14 of the base 12 and the bottom surface 18 of the lid 16 include a braze coating (not shown). During the manufacturing process, the heat sink 10 is assembled and sent through a brazing furnace where the braze coating melts, thereby attaching the outer wall 34, the spiral wall 28, and the flow diverter 20 to the base 12; and the outer wall 34 and the spiral wall 28 to the lid 16 by metallurgical bonding.

Referring to FIGS. 1 and 6, an electronic device 46 generates an amount of heat to be dissipated, the heat being transferred from the electronic device 46 to a bottom surface 48 of the base 12 of the heat sink 10. Referring back to FIGS. 2 through 6, the heat is then conducted from the base 12 to the flow diverter 20 and the spiral wall 28, where the impinging flow of cooling fluid removes the heat therefrom as it circulates through the heat sink 10.

Figure 9:
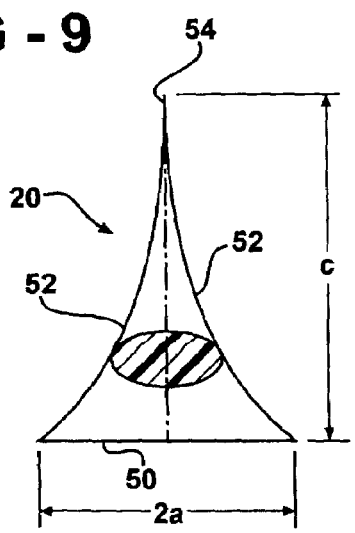
FIG. 9 is an enlarged side view of the flow diverter of the heat sink.

Referring to FIG. 9, the flow diverter is generally shown at 20, and includes a circular base 50 having a circular cross section. The flow diverter 20 preferably includes a cross section defined by two hyperbolic arcs 52 meeting at an apex 54. However, referring to FIG. 10 in which an alternative embodiment of a flow diverter is generally shown at 120, the flow diverter 120 includes a conical shape. A distinct advantage of the flow diverter 20 having a hyperbolic cross section, as shown in FIG. 9, is that its mass is 40% less than that of the conical flow diverter 120, as shown in FIG. 10, each having the same base area and the same height.

Figure 10:
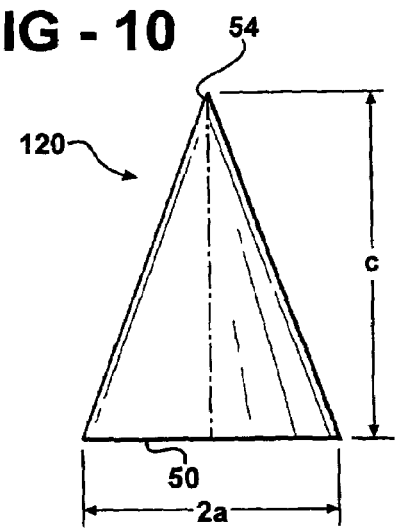
FIG. 10 is an enlarged side view of an alternative embodiment of the flow diverter.
Figure 2:
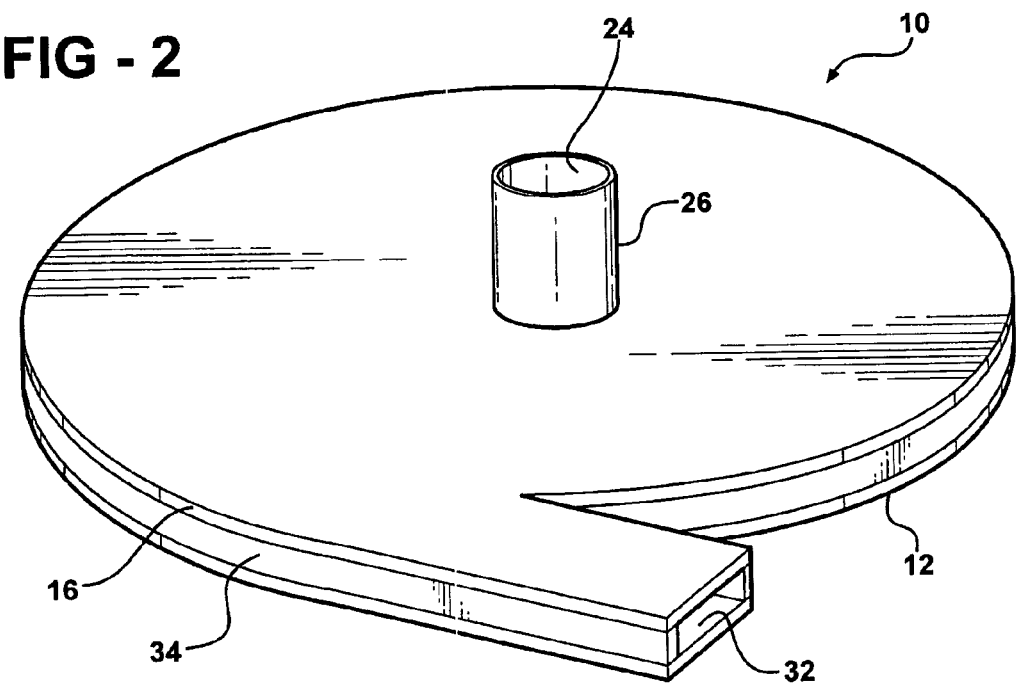
FIG. 2 is a perspective view of the heat sink of the subject invention.
Figure 3:
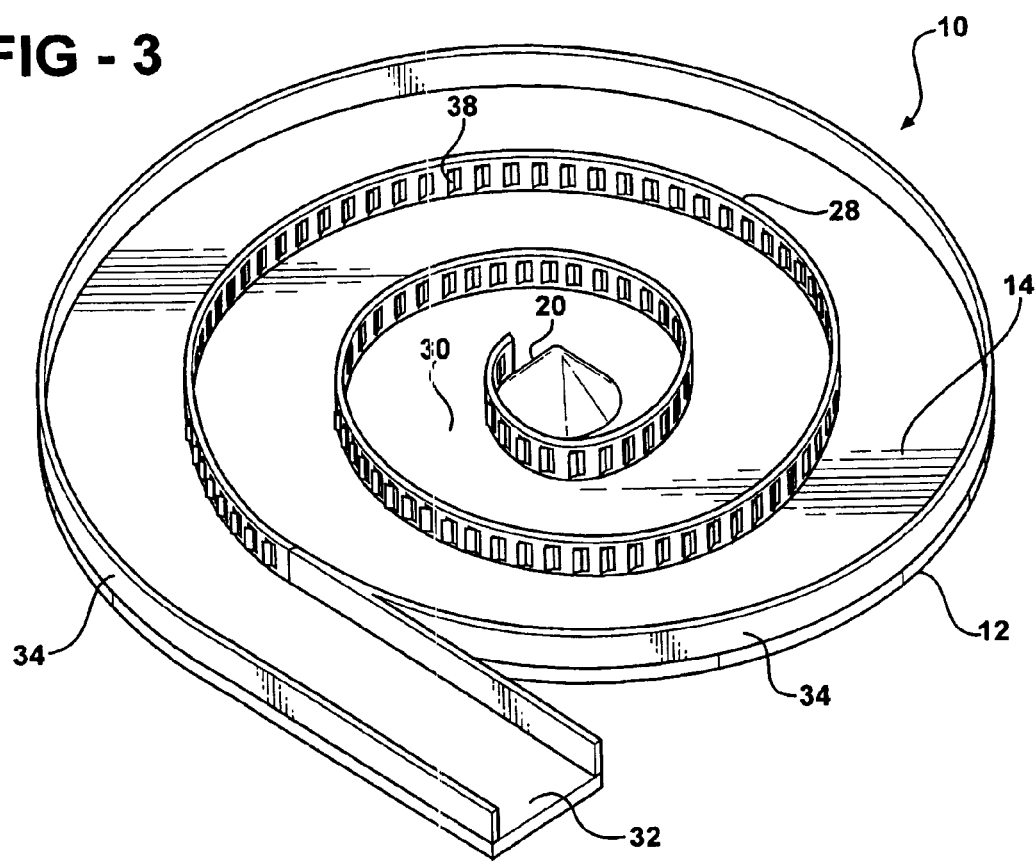
FIG. 3 is a perspective view of the heat sink without the lid.

Referring to FIGS. 9 and 10, the flow diverter 20 includes a height (c) defined by the equation:

$$\frac{c}{a} = \sqrt{\frac{0.1}{Bi_d} - \frac{1}{2}} \qquad (1)$$

where "a" is the radius of the circular base 50 and "$Bi_d$" is a dimensionless quantity called the Biot number for the flow diverter 20 defined by the equation:

$$Bi_d = \frac{ha}{k_d} \qquad (2)$$

where "$k_d$" is the thermal conductivity of the flow diverter material and "h" is the heat transfer coefficient of the cooling fluid surrounding the flow diverter 20.

The desired values of the radius (a) of the circular base 50 are in the range 0.2 in $\leq a \leq$ 0.4 in (5.1 mm $\leq a \leq$ 10.2 mm) and those of the Biot number ($Bi_d$) in the range 0.0005 $\leq Bi_d \leq$ 0.05 corresponding to the preferred values of c/a, which are in the range of 1.22 $\leq$ c/a $\leq$ 14.12.

The efficiency (φ) of the flow diverter 20 is defined as the ratio of the heat flux ($\dot{q}_d''$) on the surface of the flow diverter 20 to the heat flux ($\dot{q}_b''$) at the circular base 50 of the flow diverter 20. Since heat flux is the heat dissipation rate per unit area, the efficiency is defined by the equation:

$$\phi = \frac{\dot{q}_d''}{\dot{q}_b''} = \frac{\dot{q}_d / S_d}{\dot{q}_b / S_b} \qquad (3)$$

where "$\dot{q}_d$" is the heat dissipation rate from the surface of the flow diverter 20, "$\dot{q}_b$" is the heat dissipation rate from the circular base 50 of the flow diverter 20, "$S_d$" is the surface area of the flow diverter 20, and "$S_b$" is the area of the circular base 50.

When the flow diverter 20 having a hyperbolic cross section and the flow diverter 120 having a conical cross section are compared, wherein each of the flow diverters 20, 120 is intended to dissipate the same amount of heat and include the same circular base area but define a different surface area, the efficiency ratio between the two flow diverters 20, 120 is defined by the equation:

$$\frac{\phi_{hyperbolic}}{\phi_{conical}} = \frac{S_{conical}}{S_{hyperbolic}} \qquad (4)$$

where "$\phi_{hyperbolic}$" is the efficiency of the hyperbolic-shaped flow diverter 20, "$\phi_{conical}$" is the efficiency of the conical-shaped flow diverter 120, "$S_{hyperbolic}$" is the surface area of the hyperbolic-shaped flow diverter 20, and "$S_{conical}$" is the surface area of the conical-shaped flow diverter 120.

Since the surface area ($S_{hyperbolic}$) of the hyperbolic-shaped flow diverter 20 is less than the surface area ($S_{conical}$) of the conical-shaped flow diverter 120, each having the same base area, it follows from Equation (4) that the efficiency ($\phi_{hyperbolic}$) of the hyperbolic-shaped flow diverter 20 is greater than the efficiency ($\phi_{conical}$) of the conical-shaped flow diverter 120. Presented in Table 1 are the numerical values of the surface area ($S_{hyperbolic}$) of the hyperbolic-shaped flow diverter 20 and the surface area ($S_{conical}$) of the conical-shaped flow diverter 120 normalized by the area of the circular base 50 over a range of the ratio of the height (c) of the flow diverters 20, 120 to the radius (a) of the circular base 50. Also included in Table 1 are the numerical values of the flow diverter efficiency ratios suggested by Equation (4). The tabular results show that for the entire range of the c/a ratio, the efficiency of the hyperbolic-shaped flow diverter 20 is 17% to 49% higher than that of the conical shaped flow diverter 120.

TABLE 1

| c/a | $S_{hyperbolic}/\pi a^2$ | $S_{conical}/\pi a^2$ | $S_{conical}/S_{hyperbolic} = \phi_{hyperbolic}/\phi_{conical}$ |
|---|---|---|---|
| 1 | 1.2127 | 1.4142 | 1.1662 |
| 2 | 1.6806 | 2.2361 | 1.3305 |
| 3 | 2.2485 | 3.1623 | 1.4064 |
| 4 | 2.8585 | 4.1231 | 1.4424 |
| 5 | 3.4890 | 5.0990 | 1.4615 |
| 6 | 4.1308 | 6.0828 | 1.4725 |
| 7 | 4.7793 | 7.0711 | 1.4795 |
| 8 | 5.4322 | 8.0623 | 1.4842 |
| 9 | 6.0881 | 9.0554 | 1.4874 |
| 10 | 6.7461 | 10.0499 | 1.4897 |

Referring to FIGS. 5 and 6, the spiral wall 28 includes a spiral angle (θ) defined by the equation:

$$\theta = \left[\left(\frac{r}{a}\right)^2 - 1\right]^{2/3} \qquad (3)$$

where "r" is the local radius of the spiral and "θ" its angle of rotation in radians from the beginning of the spiral wall 28 at the flow diverter 20.

The spiral channel 30 includes a width ($s_\theta$) defined by the equation:

$$\frac{s_\theta}{a} = \sqrt{1 + (2\pi + \theta)^{3/2}} - \sqrt{1 + \theta^{3/2}} \qquad (5)$$

where "a" is the radius of the circular base 50 of the flow diverter 20. As the spiral angle (θ) increases, the width ($s_\theta$) of the spiral channel 30 becomes constant. The preferred values of $s_\theta/a$ are in the range $2 \leq s_\theta/a \leq 3$.

The spiral wall 28 includes a height (b) defined by the equation:

$$\frac{b}{t} = \frac{0.6498}{\sqrt{Bi_w}} \qquad (6)$$

where "t" is the thickness of the spiral wall 28 and "$Bi_w$" is a dimensionless quantity called the Biot number for the spiral wall 28 defined by the equation:

$$Bi_w = \frac{ht}{k_w} \qquad (7)$$

where "$k_w$" is the thermal conductivity of the spiral wall material and "h" is the heat transfer coefficient of the cooling fluid surrounding the spiral wall 28. The preferred values of the thickness (t) of the spiral wall 28 lie in the range of 0.001 in $\leq t \leq$ 0.006 in (0.025 mm $\leq t \leq$ 0.152 mm) and those of the Biot number ($Bi_w$) lie in the range of $0.000005 \leq Bi_w \leq 0.00005$ corresponding to the preferred values of b/t, which are in the range of $29 \leq b/t \leq 290$.

As the spiral angle (θ) increases, the spiral width ($s_\theta$) of the spiral channel 30 becomes constant to ensure that a flow velocity ($\bar{u}_\theta$) of the cooling fluid is maintained as the cooling fluid flows in a spiral fashion around the flow diverter 20 and through the spiral channel 30. The cooling fluid impinges onto the flow diverter 20 filling the inner spiral wall 28 spanning between 0 rad. $\leq \theta \leq 2\pi$ rad. Once the inner spiral wall 28 is filled, the flow of cooling fluid is constrained to flow primarily in a spiral fashion around the flow diverter 20 within the spiral channel 30

The mean flow velocity ($\bar{u}_\theta$) of the flow of cooling fluid through the spiral channel 30 is defined by the equation:

$$\bar{u}_\theta = \frac{\dot{m}}{\rho s_\theta b} \qquad (8)$$

where "ṁ" is the mass flow rate of the cooling fluid impinging on the flow diverter 20, "ρ" is the fluid density of the cooling fluid, "$s_\theta$" is the width of the spiral channel 30, and "b" is the height of the spiral wall 28.

Although the cooling fluid flows primarily in the θ-direction through the spiral channel 30, there is intrusion and extrusion of the fluid into the spiral channel 30 at each of the louvers 38 in the spiral wall 28 through the gaps created by the twisting of the louvers 38. The movement of the fluid at the louvers 38 serves to destabilize the thermal boundary layer on the spiral wall 28, thereby augmenting the heat transfer coefficient.

The heat transfer coefficient (h) between the spiral wall 28 and the flow of cooling fluid in the presence of the louvers 38 is defined by the equation:

$$\frac{h}{h_o} = \frac{\sqrt{na}(1+\theta^{3/2})^{1/4}+\alpha}{1+\alpha} \quad (9)$$

where "$h_o$" is the heat transfer coefficient in the absence of louvers 38, "n" is the linear density of the louvers 38 in the spiral wall 28, and "α" is the aspect ratio of the spiral channel 30. The aspect ratio (α) is defined by the equation:

$$\alpha = \frac{b}{s_\theta} \quad (10)$$

The heat transfer coefficient ($h_o$) in the absence of louvers 38 is defined for uniform wall temperature (UWT) boundary conditions by the equation:

$$\frac{h_o b}{k} = 3.770(1+\alpha)(1-2.610\alpha+4.970\alpha^2-5.119\alpha^3+2.702\alpha^4-0.548\alpha^5) \quad (11)$$

and for uniform wall heat flux (UHF) boundary conditions by the equation:

$$\frac{h_o b}{k} = 4.118(1+\alpha)(1-2.042\alpha+3.085\alpha^2-2.477\alpha^3+1.058\alpha^4-0.186\alpha^5) \quad (12)$$

where "b" is the height of the spiral wall 28, "k" is the thermal conductivity of the cooling fluid flowing through the spiral channel 30, and "α" is the aspect ratio of the spiral channel 30 defined by equation 10.

The preferred values of the louver density (n) are in the range of 15≦n≦35 louvers per inch along the spiral wall 28 (6≦n≦14 louvers per cm).

The foregoing invention has been described in accordance with the relevant legal standards; thus, the description is exemplary rather than limiting in nature. Variations and modifications to the disclosed embodiment may become apparent to those skilled in the art and do come within the scope of the invention. Accordingly, the scope of legal protection afforded this invention can only be determined by studying the following claims.

What is claimed is:

1. A cooling assembly for removing heat from an electronic device, said assembly comprising:
   a fluid pump P for circulating a flow of cooling fluid,
   a heat exchanger R for removing heat from the flow of cooling fluid,
   a heat sink including;
      a base having a top surface,
      a lid having a bottom surface in spaced relationship with and parallel to said top surface of said base,
      a flow diverter extending upwardly from said top surface of said base toward said bottom surface of said lid,
      said lid defining an inlet aligned with said flow diverter for impinging the flow of cooling fluid on said flow diverter, and
      a spiral wall extending between said top surface of said base and said bottom surface of said lid and disposed in an increasing spiral from said flow diverter to define a spiral channel having an outlet for directing the flow of cooling fluid radially in a spiral relative to said flow diverter.

2. An assembly as set forth in claim 1 wherein said spiral wall includes a plurality of louvers for creating turbulence in the flow of cooling fluid.

3. An assembly as set forth in claim 2 wherein said plurality of louvers are perpendicular to said base and parallel to each other.

4. An assembly as set forth in claim 1 wherein said flow diverter includes a conical shape.

5. An assembly as set forth in claim 4 wherein said conical shape of said flow diverter is further defined as having a hyperbolic cross section.

6. An assembly as set forth in claim 2 wherein said base defines a spiral groove in said top surface and said lid defines a corresponding spiral groove in said bottom surface, said spiral wall being disposed in said grooves.

7. An assembly as set forth in claim 6 wherein said spiral wall and said flow diverter are attached to said base by metallurgical bonding.

8. An assembly as set forth in claim 7 wherein said lid includes a top surface and said inlet includes an inlet tube extending upwardly from said top surface of said lid.

9. An assembly as set forth in claim 1 wherein said base, said lid, said spiral wall and said flow diverter include a thermally conductive material.

10. An assembly as set forth in claim 8 wherein said flow diverter includes a circular base having a circular cross section and a height (c) defined by:

$$c = a\sqrt{\frac{0.1}{\frac{ha}{k_d}} - \frac{1}{2}}$$

wherein a is the radius of said circular base of said flow diverter, h is the heat transfer coefficient of the cooling fluid, and $k_d$ is the thermal conductivity of said flow diverter.

11. An assembly as set forth in claim 2 wherein said spiral wall includes a height (b) defined by:

$$b = \frac{0.6498t}{\sqrt{\frac{ht}{k_w}}}$$

wherein t is the thickness of said spiral wall, h is the heat transfer coefficient of the cooling fluid, and $k_w$ is defined as the thermal conductivity of said spiral wall.

12. An assembly as set forth in claim 2 wherein said spiral wall includes a spiral angle (θ) defined by:

$$\theta = \left[\left(\frac{r}{a}\right)^2 - 1\right]^{2/3}$$

wherein r is the radius of said spiral wall and a is the radius of said circular base of said flow diverter.

13. An assembly as set forth in claim 2 wherein said spiral channel includes a channel width ($s_\theta$) defined by:

$$\frac{s_\theta}{a} = \sqrt{1 + (2\pi + \theta)^{3/2}} - \sqrt{1 + \theta^{3/2}}$$

wherein a is the radius of said circular base of said flow diverter and θ is said spiral angle of said spiral wall.

14. A heat sink assembly for removing heat from an electronic device, said assembly comprising;
a base having a top surface,
a lid having a bottom surface in spaced relationship with and parallel to said top surface of said base,
a flow diverter extending upwardly from said top surface of said base toward said bottom surface of said lid,
said lid defining an inlet aligned with said flow diverter for impinging the flow of cooling fluid on said flow diverter, and
a spiral wall extending between said top surface of said base and said bottom surface of said lid and disposed in an increasing spiral from said flow diverter to define a spiral channel having an outlet for directing the flow of cooling fluid radially in a spiral relative to said flow diverter.

15. An assembly as set forth in claim 14 wherein said spiral wall includes a plurality of louvers for creating turbulence in the flow of cooling fluid.

16. An assembly as set forth in claim 15 wherein said plurality of louvers are perpendicular to said base and parallel to each other.

17. An assembly as set forth in claim 14 wherein said flow diverter includes a conical shape.

18. An assembly as set forth in claim 17 wherein said conical shape of said flow diverter is further defined as having a hyperbolic cross section.

19. An assembly as set forth in claim 15 wherein said base defines a spiral groove in said top surface and said lid defines a corresponding spiral groove in said bottom surface, said spiral wall being disposed in said grooves.

20. An assembly as set forth in claim 19 wherein said spiral wall and said flow diverter are attached to said base by metallurgical bonding.

21. An assembly as set forth in claim 20 wherein said lid includes a top surface and said inlet includes an inlet tube extending upwardly from said top surface of said lid.

22. An assembly as set forth in claim 14 wherein said base, said lid, said spiral wall and said flow diverter include a thermally conductive material.

23. An assembly as set forth in claim 21 wherein said flow diverter includes a circular base having a circular cross section and a height (c) defined by:

$$c = a\sqrt{\frac{0.1}{\frac{ha}{k_d}} - \frac{1}{2}}$$

wherein a is the radius of said circular base of said flow diverter, h is the heat transfer coefficient of the cooling fluid, and $k_d$ is the thermal conductivity of said flow diverter.

24. An assembly as set forth in claim 23 wherein said height (c) of said flow diverter is in the range of $1.22 \leq c/a \leq 14.12$.

25. An assembly as set forth in claim 15 wherein said spiral wall includes a height (b) defined by:

$$b = \frac{t(0.6498)}{\sqrt{\frac{ht}{k_w}}}$$

wherein t is the thickness of said spiral wall, h is the heat transfer coefficient of the cooling fluid, and $k_w$ is defined as the thermal conductivity of said spiral wall.

26. An assembly as set forth in claim 25 wherein said height (b) of said spiral wall is in the range of $29 \leq b/t \leq 290$; where t is the thickness of said spiral wall.

27. An assembly as set forth in claim 15 wherein said spiral wall includes a spiral angle (θ) defined by:

$$\theta = \left[\left(\frac{r}{a}\right)^2 - 1\right]^{2/3}$$

wherein r is the radius of said spiral wall and a is the radius of said circular base of said flow diverter.

28. An assembly as set forth in claim 15 wherein said spiral channel includes a channel width ($s_\theta$) defined by:

$$\frac{s_\theta}{a} = \sqrt{1 + (2\pi + \theta)^{3/2}} - \sqrt{1 + \theta^{3/2}}$$

wherein a is the radius of said circular base of said flow diverter and θ is said spiral angle of said spiral wall.

29. An assembly as set forth in claim 28 wherein said channel width ($s_\theta$) of said spiral channel is in the range of $2 \leq s_\theta/a \leq 3$; where a is the radius of said circular base of said flow diverter.

* * * * *